United States Patent
Kainosho et al.

(10) Patent No.: US 6,875,272 B2
(45) Date of Patent: Apr. 5, 2005

(54) METHOD FOR PREPARING GAN BASED COMPOUND SEMICONDUCTOR CRYSTAL

(75) Inventors: Keiji Kainosho, Saitama (JP); Shinichi Sasaki, Toda (JP)

(73) Assignee: Nikko Materials Co., Ltd., Tokyo (JP)

( * ) Notice: Subject to any disclaimer, the term of this patent is extended or adjusted under 35 U.S.C. 154(b) by 0 days.

(21) Appl. No.: 10/481,253

(22) PCT Filed: Jun. 14, 2002

(86) PCT No.: PCT/JP02/05936
§ 371 (c)(1),
(2), (4) Date: Dec. 18, 2003

(87) PCT Pub. No.: WO03/000964
PCT Pub. Date: Jan. 3, 2003

(65) Prior Publication Data
US 2004/0171253 A1 Sep. 2, 2004

(30) Foreign Application Priority Data
Jun. 21, 2001 (JP) .......................... 2001-187648

(51) Int. Cl.[7] .............................................. C30B 25/14
(52) U.S. Cl. ............................ 117/90; 117/81; 117/93; 117/102; 117/104; 117/105
(58) Field of Search ................................ 117/90, 84, 93, 117/102, 104, 105

(56) References Cited

U.S. PATENT DOCUMENTS 6,086,673 A * 7/2000 Molnar ..................... 117/90

FOREIGN PATENT DOCUMENTS

| JP | WO 95/027815 A1 | 10/1995 |
| JP | 8-208385 A | 8/1996 |
| JP | 9-208396 A | 8/1997 |
| JP | 803594 A1 | 10/1997 |
| JP | 2002-261026 A | 9/2002 |

* cited by examiner

Primary Examiner—Robert Kunemund
(74) Attorney, Agent, or Firm—Birch, Stewart, Kolasch & Birch, LLP

(57) ABSTRACT

In a method for growing a GaN based compound semiconductor on a front surface of a substrate to obtain the GaN based compound semiconductor crystal in one body, because the gas for reducing and decomposing the substrate is supplied to the rear surface of the substrate and a heat treatment is carried out in a gas atmosphere in which the nitrogen partial pressure is not less than a predetermined value, in order to remove the substrate, it can be prevented that cracks are caused in the crystal, or fracture or warp is caused by causing strain of the GaN based compound semiconductor crystal in a cooling step.

4 Claims, 1 Drawing Sheet

METHOD FOR PREPARING GAN BASED COMPOUND SEMICONDUCTOR CRYSTAL

TECHNICAL FIELD

The present invention relates to a method for preparing GaN based compound semiconductor crystal, which is used in the manufacturing of a semiconductor device, such as a light emitting device, an electronic device. The present invention relates to a technique for effectively preventing cracks from being caused in a GaN based compound semiconductor crystal.

BACKGROUND OF THE INVENTION

A GaN based compound semiconductor crystal ($In_xGa_yAl_{1-x-y}N$, where $0 \leq x, y; x+y \leq 1$), such as GaN, InGaN, AlGaN, InGaAlN, is expected as a material of a semiconductor device, such as a light emitting device, a power device, and is noticed as a material which can be applied in other various fields.

In an earlier development, because it was difficult to grow a bulk crystal of a GaN based compound semiconductor, a substrate made by heteroepitaxially forming a thin film single crystal, such as GaN, on a different single crystal, such as sapphire, was used for the above electronic device.

However, because a lattice mismatching between a sapphire crystal and a GaN based compound semiconductor crystal is large, there was a problem that the dislocation density of the GaN based compound semiconductor crystal grown on the sapphire crystal is large and a crystal defect is caused. Further, because the sapphire has a low heat conductivity and it is difficult to release heat, there was a problem that when a substrate made by growing a GaN based compound semiconductor crystal on the sapphire crystal was used for an electronic device or the like, in which consumption power was large, a temperature thereof easily became high.

A substrate having a large heat conductivity and having the lattice matching with the GaN based compound semiconductor crystal, is strongly required. The ELO (Epitaxial lateral overgrowth) method using the hydride vapor phase epitaxy (hereinafter, abbreviated to HVPE), or the like has been rapidly researched. In this case, the ELO method is a method in which an insulting film is formed as a mask, for example, on a sapphire substrate and the insulting film is used as a mask by providing an opening portion on a part of the insulting film. Then, a high crystalline GaN based compound semiconductor crystal is grown by using the exposed sapphire substrate surface as a seed for the epitaxial growth. According to the method, because the growth of the GaN based compound semiconductor crystal is started from the sapphire substrate surface in the opening portion provided on the mask and the growth layer is expanded on the mask, the dislocation density in the crystal can be suppressed. It is possible to obtain the GaN based compound semiconductor crystal having little crystal defect.

However, because the GaN based compound semiconductor crystal obtained by the ELO method has a large heat strain, there was a problem that the GaN based compound semiconductor crystal wafer is strained when the sapphire substrate is removed by the polishing in a wafer manufacturing process to obtain the GaN based compound semiconductor crystal wafer.

The inventors proposed a method for heteroepitaxially growing the GaN based compound semiconductor crystal by using a rear earth 13 (3B) group of perovskite crystal as a material of a different single crystal substrate and by using {011} face or {101} face thereof as a growth surface (WO95/27815). In this case, {011} face or {101} face is equivalent to (011) face or (101) face, respectively.

According to the growing technology in the prior application, when GaN is grown, for example, on the {011} face or the {101} face of $NdGaO_3$ which is one of the rear earth 13 (3B) group of perovskites and is used as a substrate, the lattice mismatching is decreased to about 1.2%. The value of the lattice mismatching is relatively low as compared with the value of the lattice mismatching in case that a sapphire or SiC used as a substitution thereof is used as a substrate. Because the dislocation density in the crystal is low, it is possible to grow the GaN based compound semiconductor crystal having little crystal defect.

However, when a GaN based compound semiconductor crystal was grown on the $NdGaO_3$ substrate by using the growth method in the prior application, it was found that cracks, fracture, warp or the like are caused in both the $NdGaO_3$ substrate and the grown GaN crystal. In particular, when the cracks were caused in the GaN crystal, it was not possible to obtain a large and excellent GaN thick substrate. Therefore, the most serious problem was caused.

An object of the present invention is to provide a method for preparing GaN based compound semiconductor crystal, in which it is prevented by carrying out a reducing and decomposing process for a substrate before a cooling step to remove the substrate that cracks are caused in the GaN based compound semiconductor crystal.

DISCLOSURE OF THE INVENTION

The present invention was made in order to accomplish the above-described object. In a method for growing a GaN based compound semiconductor on a front surface of a substrate to obtain a GaN based compound semiconductor crystal in one body, the substrate is removed by supplying gas for reducing and decomposing the substrate to a rear surface (the surface opposite to a crystal growth surface) of the substrate and by carrying out a heat treatment, in a gas atmosphere in which a nitrogen partial pressure is not less than a predetermined value, after the growing of the GaN based compound semiconductor or during the growing of the GaN based compound semiconductor. That is, after removing the crystal substrate by reducing and decomposing it and obtaining the GaN based compound semiconductor crystal in one body, a cooling step is carried out.

The substrate may be kept in the reducing and decomposing gas atmosphere after growing the GaN based compound semiconductor crystal. The reducing and decomposing gas may be supplied to the rear surface of the substrate while growing the GaN based compound semiconductor crystal.

Thereby, it is possible to prevent that cracks are caused in the crystal by causing strain in a cooling step, or fracture or warp is caused because the coefficient of the thermal expansion of the substrate is largely different from the coefficient of the thermal expansion of the GaN crystal. Further, because of the gas atmosphere in which the nitrogen partial pressure is not less than a predetermined value, it is possible to prevent that the GaN based compound semiconductor crystal is decomposed in a heat treatment step for reducing and decomposing the substrate.

In this case, the nitrogen partial pressure which is not less than a predetermined value, means a partial pressure which is larger than the dissociation pressure (the partial pressure of decomposed nitrogen) of the GaN based compound semiconductor at the heat treatment temperature. Further, for example, hydrogen gas or gas including hydrogen is suitable for the gas for reducing and decomposing the substrate.

In the concrete, the heat treatment is carried out in a hydrogen atmosphere in which the nitrogen partial pressure is not less than a predetermined value by supplying a matter capable of supplying a nitrogen atom, after growing the GaN based compound semiconductor crystal on the substrate. Therefore, because the rear surface of the substrate is exposed to hydrogen, it is possible to easily reduce and decompose the substrate.

In this case, for example, ammonia ($NH_3$), hydrazine ($N_2H_4$) or the like is suitable for the matter capable of supplying a nitrogen atom. Therefore, it is possible to prevent the reducing and decomposing reaction of the GaN compound semiconductor crystal more effectively than the case that $N_2$ gas which is stable at the heat treatment temperature (about 1000° C.) is supplied.

It is desirable that the matter capable of supplying the nitrogen atom is supplied so that a gas partial pressure thereof is at least not less than 1%. That is, an effect that the decomposing reaction of the GaN based compound semiconductor crystal is suppressed by mixing a small quantity of matter capable of supplying the nitrogen atom, can be obtained. Therefore, by adding a small quantity of matter capable of supplying the nitrogen atom and by increasing hydrogen concentration as much as possible, it is possible to effectively reduce and decompose the crystal substrate in order to remove it.

In the gas atmosphere in which the nitrogen partial pressure is not less than a predetermined value, the substrate can be removed by supplying the gas for reducing and decomposing the substrate to the rear surface of the substrate and by carrying out the heat treatment in a state that the reducing and decomposing gas is not in contact with the GaN based compound semiconductor crystal grown on the surface of the substrate. In the concrete, a jig, such as a substrate susceptor (substrate supporter) is contrived so as not to supply the reducing and decomposing gas to the front surface of the GaN based compound semiconductor crystal. The rear surface of the substrate is directly blown with the reducing and decomposing gas. Thereby, it is possible to reduce and decompose the substrate while growing the GaN based compound semiconductor crystal. It is possible to improve the productivity.

Further, in this case, it is desirable that hydrogen or hydrogen chloride gas is used as a reducing and decomposing gas. Therefore, because the substrate is etched, it is possible to remove the substrate more effectively.

The above-described method can be applied to the case that the crystal substrate which can be reduced and decomposed, is used. In particular, the method is suitable for the use of a rare earth 13 (3B) group of perovskite crystal substrate including one or more types of rare earth elements, wherein the crystal substrate includes at least one selected from Al, Ga and In as a 13 (3B) group of element, for example, $NdGaO_3$ or the like.

In the above-described method, a substrate, such as MaO, $MgAl_2O_4$, $LiAlO_2$, $LiTaO_3$, $LiNbO_3$, ZnO, $(LaAlO_3)_{0.3}(SrAl_{0.5}Ta_{0.5}O_3)_{0.7}$, $YAlO_3$, which can be etched by hydrogen or HCl gas, can be used.

It is desirable that the GaN based compound semiconductor crystal is formed on the substrate by a hydride VPE method.

Hereinafter, the process for making the present invention will be explained.

In an earlier development, in order to obtain a GaN based compound semiconductor crystal, the inventors grew a GaN based compound semiconductor on an $NdGaO_3$ substrate in accordance with the growing method proposed by the prior application. However, it was found that cracks ware caused in all of the GaN based compound semiconductor crystal obtained by the above growing method. In case that the cracks were caused in the crystal, it was not possible to obtain a large and excellent GaN thick film crystal. It was found that the method is not suitable as a method for producing GaN based compound semiconductor crystal suitable for a material of a semiconductor device.

As a result of researching the cause of the cracks caused in the GaN based compound semiconductor crystal grown by the above growing method, it was found that warp or cracks were caused in a cooling step after growing the GaN crystal and that the coefficient of thermal expansion of $NdGaO_3$ of $7.5 \times 10^{-6}$/K was largely different from the coefficient of thermal expansion of GaN of $5.59 \times 10^{-6}$/K.

Because the coefficient of thermal expansion of $NdGaO_3$ was considerably larger than the coefficient of thermal expansion of GaN, it was assumed that the $NdGaO_3$ was largely shrunk in the cooling step after growing the GaN crystal. On the other hand, it was assumed that tensile stress was applied to the GaN crystal by shrinking the $NdGaO_3$. As a result, the warp or the cracks were caused in both the $NdGaO_3$ substrate and GaN crystal.

On the basis of the assumption, the inventors considered that a crack-free GaN crystal could be obtained if the $NdGaO_3$ substrate was removed in a step before the cooling step, and studied the method thereof. The inventors proposed a method for reducing and decomposing $NdGaO_3$ in a hydrogen atmosphere (reducing and decomposing gas atmosphere) while keeping a temperature after growing the GaN crystal on the $NdGaO_3$ substrate. Further, the inventors carried out various experience in order to determine the conditions for decomposing the $NdGaO_3$ substrate more effectively.

At first, in case that a heat treatment was carried out in 100% hydrogen atmosphere for 4 hours at 1000° C., the amount of the reduction in weight of $NdGaO_3$ was 0.11 g/cm$^2$ and the substrate was reduced and decomposed. However, in this case, because the nitrogen partial pressure was 0, GaN was also decomposed.

Therefore, nitrogen was supplied so as to have a predetermined nitrogen partial pressure to reduce and decompose $NdGaO_3$ while suppressing the decomposition of GaN. In this case, it is theoretically necessary that the nitrogen partial pressure for suppressing the decomposition of GaN was larger than the dissociation pressure (the partial pressure of decomposed nitrogen) of the GaN based compound semiconductor at the heat treatment temperature.

However, because nitrogen gas ($N_2$) is stable at the heat treatment temperature of about 1000° C., and is not decomposed to nitrogen atoms, it is considered that even though nitrogen gas is supplied so as to apply the nitrogen partial pressure, the effect that the decomposing reaction of GaN is prevented is small. Therefore, the inventors considered that it is possible to suppress the decomposition of GaN more effectively by supplying the matter capable of supplying a nitrogen atom to the hydrogen atmosphere. For example, ammonia, hydrazine or the like was used.

When the experience was carried out by changing the ratio of hydrogen and ammonia in case that ammonia was used as a matter capable of supplying a nitrogen atom, the result shown in FIG. 1 was obtained. From this figure, it was found that the amount of reduction in weight (the amount of reduction and decomposition) of $NdGaO_3$ during the constant treatment time was decreased as the amount of supplied ammonia was increased and the hydrogen concentration was decreased. Further, it was found that $NdGaO_3$ could be reduced and decomposed by lengthening the treatment time even under the condition that the gas pressure of hydrogen was 10% and that of ammonia was 90%.

From the experience, it was confirmed that the decomposition of GaN could be prevented only by supplying ammonia so that the partial pressure thereof was 5%. However, it is thought that by adding the matter (ammonia, hydrazine or the like) capable of supplying a nitrogen atom so that the partial pressure thereof is at least not less than 1%, the effect that the decomposition of GaN is prevented is obtained.

With respect to the reduction and decomposition of the $NdGaO_3$ substrate in an atmosphere in which 10% of hydrogen and 90% of ammonia by partial pressure were mixed, when the experience for inspecting the amount of reduction in weight as a function of heat treatment time, was carried out by changing the heat treatment time, the result shown in FIG. 2 was obtained. From this figure, it was found that the amount of reduction in weight of $NdGaO_3$ was increased as the heat treatment time was long. That is, because it was thought that the heat treatment time was in proportion to the amount of reduction in weight, it was confirmed that the $NdGaO_3$ could be completely reduced and decomposed by adjusting the heat treatment time to remove it.

As a result of carrying out the further experiment, it was found that the crystal used as a substrate was not limited to $NdGaO_3$, and that the above-described method could be applied if the substrate was suitable for the growth of the GaN based compound semiconductor and the crystal could be reduced and decomposed. For example, there is some possibility that rare earth 13 (3B) group of perovskite crystals other than $NdGaO_3$, or a crystal, such as MaO, $MgAl_2O_4$, $LiAlO_2$, $LiTaO_3$, $LiNbO_3$, ZnO, $(LaAlO_3)_{0.3}(SrAl_{0.5}Ta_{0.5}O_3)_{0.7}$, $YAlO_3$, can be used as a substrate.

Further, it was found that the GaN based compound semiconductor crystal could be also reduced and decomposed by directly blowing the rear surface of the substrate with the reducing and decomposing gas in a state that the reducing and decomposing gas was not supplied to the front surface of the GaN based compound semiconductor crystal. In this case, because the substrate can be removed during the growth, it is possible to improve the productivity of the GaN based compound semiconductor crystal. Further, because $H_2$ gas, $H_2+NH_3$ gas, etching gas, such as HCl, $NH_3$ or the like can be used as the reducing and decomposing gas, there is an advantage of removing the substrate more effectively.

The present invention was made in accordance with the above knowledge. By adapting the present invention, it is possible to obtain the GaN based compound semiconductor thick film crystal having no cracks at the probability of not less than 90%.

BEST MODE FOR CARRYING OUT THE INVENTION

Figure 1:
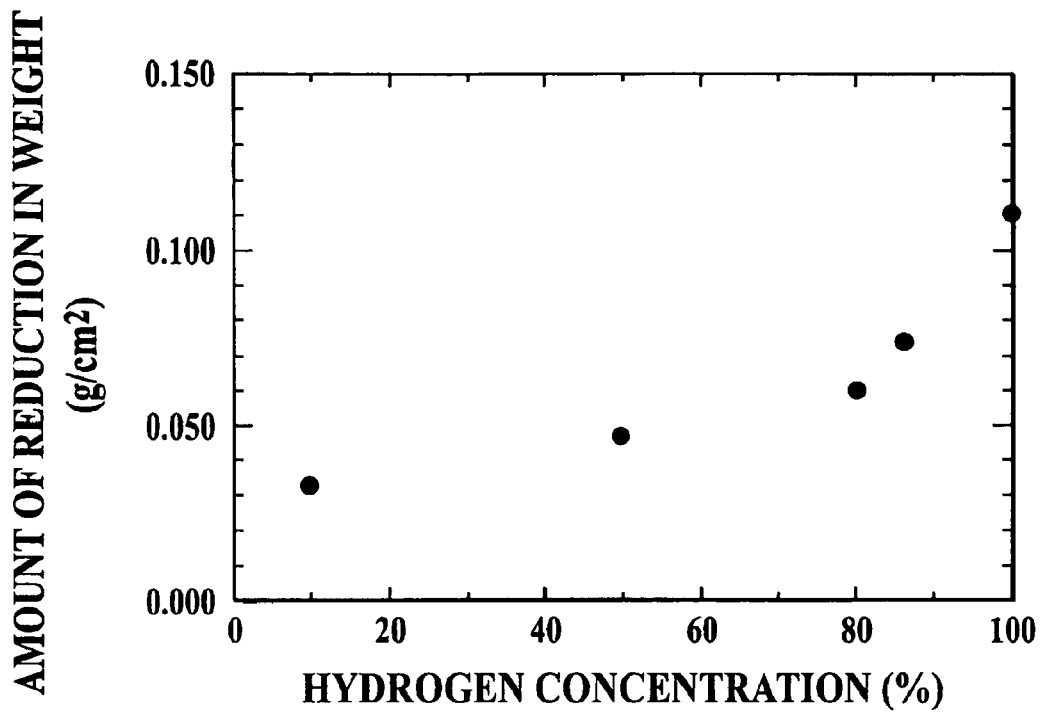
FIG. 1 is a graph showing the relation between hydrogen concentration and an amount of reduction in weight of $NdGaO_3$.
Figure 2:
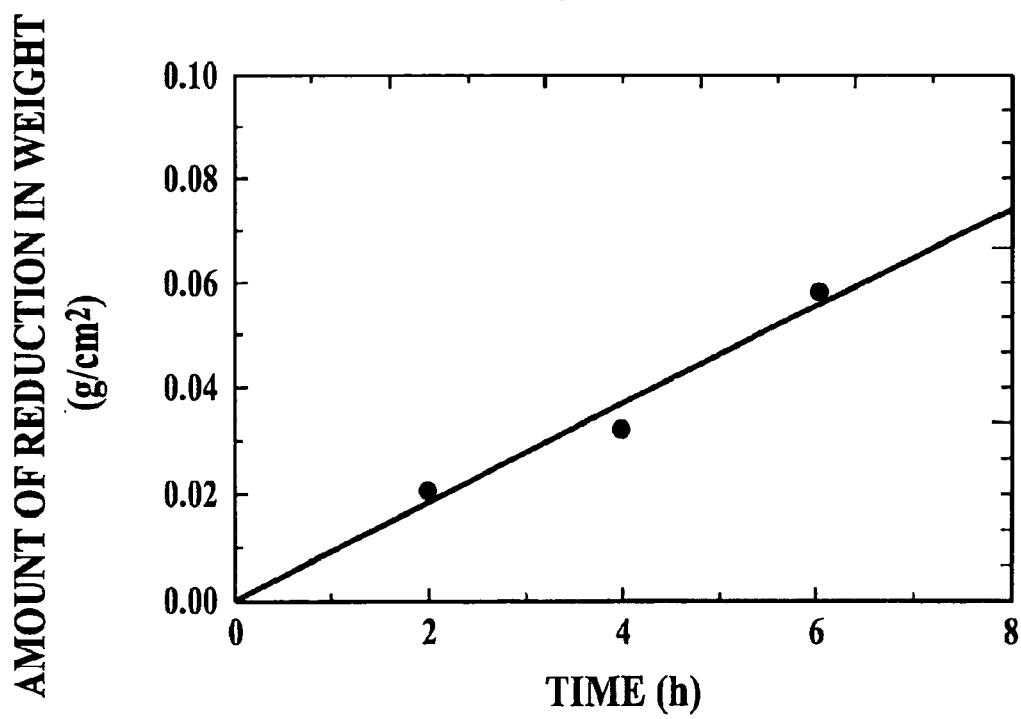
FIG. 2 is a graph showing the relation between heat treatment time and an amount of reduction in weight of $NdGaO_3$.

Hereinafter, a preferred embodiment of the present invention will be explained in case that a GaN compound semiconductor crystal is grown by using an $NdGaO_3$ crystal as a substrate.

Firstly, a substrate for growing a crystal was made by slicing an ingot of $NdGaO_3$. In this case, the $NdGaO_3$ substrate had a diameter of 50 mm and a thickness of 350 $\mu$m.

Next, the mirror-polished $NdGaO_3$ substrate was cleaned by ultrasonic cleaning in acetone for 5 minutes and then was cleaned by ultrasonic cleaning in methanol for 5 minutes. Thereafter, droplets ware blown with $N_2$ gas and the substrate was naturally dried. Next, the cleaned $NdGaO_3$ substrate was etched in sulfuric acid based etchant (phosphoric acid: sulfuric acid=1:3, 80° C.) for 5 minutes.

Next, after the $NdGaO_3$ substrate was set on a predetermined portion in a hydride VPE apparatus, a substrate temperature was raised to 620° C. while $N_2$ gas was introduced. GaCl made from Ga metal and HCl gas, and $NH_3$ gas were supplied to the $NdGaO_3$ substrate by using $N_2$ carrier gas to form a GaN protect layer having a thickness of about 100 nm. Because $NdGaO_3$ reacts with $NH_3$ or $H_2$ at a high temperature of not less than 800° C. to produce neodymium compounds, $N_2$ is used as a carrier gas in this embodiment. By forming a protect layer at a growth temperature that is a low temperature of 620° C., it is prevented that neodymium compounds are produced.

Next, the substrate temperature was raised to 1000° C., and GaCl made from Ga metal and HCl gas, and $NH_3$ gas were supplied to the $NdGaO_3$ substrate by using $N_2$ carrier gas. Then, while each amount of gas to be introduced was controlled so as to adjust the GaCl partial pressure to $5.0\times10^{-3}$ atm and the $NH_3$ partial pressure to $3.0\times10^{-1}$ atm, the GaN compound semiconductor crystal was grown at a growing rate of about 40 $\mu$m/h for 300 minutes.

Then, the carrier gas was changed from $N_2$ gas to $H_2$ gas. By adjusting the gas partial pressures $H_2$ and $NH_3$ to 90% and 10%, respectively, the heat treatment was carried out for 11 hours. In the heat treatment, the $NdGaO_3$ substrate having a thickness of 350 $\mu$m was decomposed by reducing it. All of the substrate could be removed.

Thereafter, the crystal was cooled at a cooling rate of 5.3° C./min for 90 minutes. The GaN thick film crystal having a thickness of about 200 $\mu$m and a diameter of 50 mm, in which no crack was caused, could be obtained.

Further, after the GaN thick film crystal was grown at the same conditions as the above-described embodiment, the experience in which the heat treatment was carried out while changing the amount of $NH_3$ to be introduced, was repeatedly carried out. As a result, as the ratio of $H_2$ was decreased, the heat treatment time for completely decomposing the $NdGaO_3$ substrate became longer. However, it was possible to decompose and remove the $NdGaO_3$ substrate by reducing it without causing some problem and to obtain a crack-free GaN thick film crystal.

On the other hand, in case that the $NdGaO_3$ of the present invention was not decomposed by reducing it nor was not removed after the GaN thick film crystal was grown at the same conditions as the above-described embodiment, cracks were caused in all of the GaN crystals. Only the GaN crystal of 1 cm square at the maximum could be obtained.

As described above, the present invention made by the inventors was explained concretely in accordance with the embodiment. However, the present invention is not limited to the embodiment.

For example, the present invention is not limited to the case that the GaN compound semiconductor crystal is grown. Although the present invention is adapted to the method for producing a GaN based compound semiconductor crystal, such as InGaN, AlGaN or the like, it is possible to obtain the same effect.

The substrate for growing a crystal is not limited to an $NdGaO_3$ crystal. There is some possibility that for example, rare earth 13 (3B) group of perovskite crystal, such as $NdAlO_3$, $NdInO_3$ or the like, or a crystal, such as MgO, $MgAl_2O_4$, $LiAlO_2$, $LiTaO_3$, $LiNbO_3$, ZnO, $(LaAlO_3)_{0.3}(SrAl_{0.5}Ta_{0.5}O_3)_{0.7}$, $YAlO_3$ or the like, can be used as a substrate.

As a crystal growing condition, it is desirable that the GaCl partial pressure is $1.0 \times 10^{-3}$ to $1.0 \times 10^{-2}$ atm, the $NH_3$ partial pressure is $1.0 \times 10^{-1}$ to $4.0 \times 10^{-1}$ atm, the growing rate is 30 to 100 $\mu$m/h, the growing temperature is 930 to 1050° C. and the cooling rate is 4 to 10° C./min.

In the embodiment, $NH_3$ was used as a matter capable of supplying a nitrogen atom. Even though hydrazine ($N_2H_4$) is used instead of $NH_3$, it is possible to obtain the same effect that the decomposing reaction of GaN is prevented.

Because the decomposing reaction of GaN is prevented only by mixing a small quantity of matter (for example, not less than 1% by gas partial pressure) capable of supplying a nitrogen atom, such as $NH_3$ or the like, in a hydrogen atmosphere, it is desirable that the hydrogen concentration is as high as possible in order to effectively proceed the reduction and decomposition reaction of $NdGaO_3$.

Further, when reducing and decomposing gas directly blows to a rear surface of the substrate in a condition that the gas is not supplied to a front surface of the GaN based compound semiconductor crystal, it is possible to reduce and decompose the substrate while growing the GaN based compound semiconductor crystal. In this case, it is necessary to contrive a jig, such as a substrate susceptor (substrate supporter) so as not to supply the reducing and decomposing gas to the front surface of the GaN based compound semiconductor crystal. The substrate susceptor may have a structure in which for example, a gas introducing pipe, such as a quartz pipe, capable of blowing the rear surface of the substrate with the reducing and decomposing gas when the substrate is mounted on the substrate susceptor, and an exhausting portion for exhausting the reducing and decomposing gas for blowing the rear surface of the substrate, are provided. In this case, a closed structure may be formed by the exhausting portion, the quartz pipe and the like. In this case, as a reducing and decomposing gas, $H_2$ gas, $H_2+NH_3$ gas and etching gas, such as HCl, $NH_3$ or the like, can be used. There is an advantage of removing the substrate more effectively.

According to the present invention, because the gas for reducing and decomposing the substrate is supplied to the rear surface of the substrate and a heat treatment is carried out in a gas atmosphere in which the nitrogen partial pressure is not less than a predetermined value, after the growing of the GaN based compound semiconductor or during the growing thereof in order to remove the substrate, it is possible to obtain an effect in which it can be prevented that cracks are caused in a crystal by causing strain in a cooling step, or that fracture or warp is caused.

Further, because the nitrogen partial pressure is not less than a predetermined value, the GaN based compound semiconductor crystal is not decomposed.

INDUSTRIAL APPLICABILITY

The present invention is not limited to the growth of the GaN based compound semiconductor crystal, and can be adapted to other compound semiconductor crystals.

What is claimed is:

1. A method for producing a GaN based compound semiconductor crystal, comprising:

growing a GaN based compound semiconductor on a front surface of a substrate to obtain the GaN based compound semiconductor crystal in one body; and removing the substrate by supplying gas for reducing and decomposing the substrate to a rear surface of the substrate and by carrying out a heat treatment, in a hydrogen atmosphere in which a nitrogen gas partial pressure is not less than a dissociation pressure of the GaN based compound semiconductor at a heat treatment temperature by supplying a matter capable of supplying a nitrogen atom and in which a hydrogen gas partial pressure is at least not less than 80%, after the growing of the GaN based compound semiconductor.

2. The method for producing the GaN based compound semiconductor crystal, as claimed in claim 1, wherein the matter capable of supplying the nitrogen atom is supplied so that a gas partial pressure thereof is at least not less than 1%.

3. The method for producing the GaN based compound semiconductor crystal, as claimed in claim 1, wherein the matter capable of supplying the nitrogen atom is ammonia or hydrazine.

4. The method for producing the GaN based compound seminconductor crystal, as claimed in claim 2, wherein the matter capable of supplying the nitrogen atom is ammonia or hydrazine.

* * * * *